(12) United States Patent
Flachowsky et al.

(10) Patent No.: US 8,962,429 B2
(45) Date of Patent: Feb. 24, 2015

(54) INTEGRATED CIRCUITS WITH IMPROVED SPACERS AND METHODS FOR FABRICATING SAME

(75) Inventors: Stefan Flachowsky, Dresden (DE); Jan Hoentschel, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 190 days.

(21) Appl. No.: 13/572,343

(22) Filed: Aug. 10, 2012

(65) Prior Publication Data

US 2014/0042550 A1 Feb. 13, 2014

(51) Int. Cl.
*H01L 21/336* (2006.01)

(52) U.S. Cl.
USPC .......................................................... 438/296

(58) Field of Classification Search
USPC ................................ 438/296–308
See application file for complete search history.

(56) References Cited

U.S. PATENT DOCUMENTS

| | | | | |
|---|---|---|---|---|
| 6,051,863 A | * | 4/2000 | Hause et al. | 257/369 |
| 2002/0027254 A1 | * | 3/2002 | Kwean | 257/382 |
| 2013/0092954 A1 | * | 4/2013 | Yang et al. | 257/77 |

* cited by examiner

*Primary Examiner* — Matthew W Such
*Assistant Examiner* — Ali Naraghi
(74) *Attorney, Agent, or Firm* — Ingrassia Fisher & Lorenz, P.C.

(57) ABSTRACT

Integrated circuits and methods for fabricating integrated circuits are provided. In an embodiment, a method for fabricating an integrated circuit includes simultaneously shielding a shielded region of a semiconductor substrate and exposing a surface of the shielded region of the semiconductor substrate. An ion implantation is performed to form implant areas in a non-shielded region of the semiconductor substrate adjacent the shielded region. Also, the semiconductor substrate is silicided to form a silicided area in the shielded region of the semiconductor substrate.

20 Claims, 5 Drawing Sheets

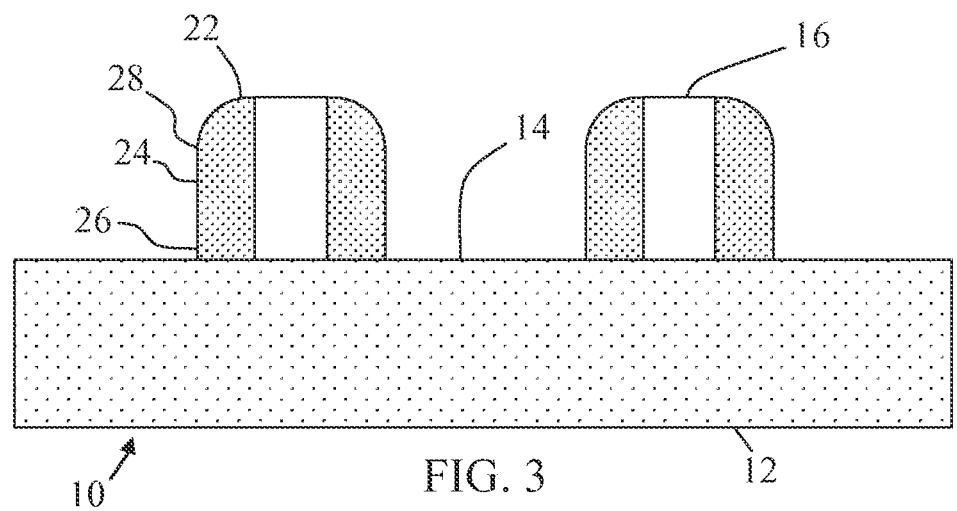
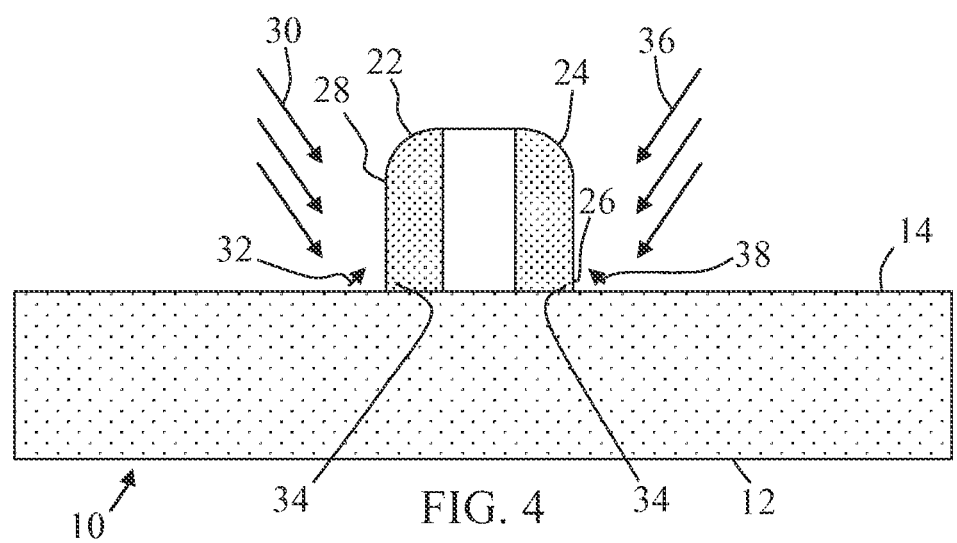

INTEGRATED CIRCUITS WITH IMPROVED SPACERS AND METHODS FOR FABRICATING SAME

TECHNICAL FIELD

The present disclosure generally relates to integrated circuit and methods for fabricating integrated circuits, and more particularly relates to integrated circuits with improved spacers for providing more than one alignment for subsequent processing.

BACKGROUND

In the fabrication of modern microstructures, such as integrated circuits, there is a continuous drive to steadily reduce the feature sizes of microstructure elements, thereby enhancing the functionality of these structures. As the size of individual transistors is reduced with every new circuit generation, the space between adjacent gates in the transistors is becoming the limiting factor for further scaling. Specifically, the reduction in space between adjacent gates results in a smaller amount of area that can be used for silicide formation of contacts. With smaller contact area, contact resistance cannot be sufficiently reduced.

The space between adjacent gates is limited not only by gate pitch, but also be gate length and spacer width. Gate length cannot be easily reduced due to sub-threshold leakage increasing exponentially with smaller gate size and due to short channel effects degrading device characteristics. Therefore, it is desirable to reduce spacer width.

However, in typical processing spacers are necessary to offset the source/drain implants from the channel region. After implants are formed, the thermal annealing process typically causes the implanted junction profile to diffuse under the gate. If the implanted junctions have not been offset appropriately during implant, diffusion under the gate can cause an electrical short. Therefore, the implant offset is vital to keep the implanted junctions away from the channel region.

Accordingly, it is desirable to provide integrated circuits and methods for forming integrated circuits with improved spacers. In addition, it is desirable to provide integrated circuits and methods for fabricating integrated circuits which form spacers having maximum thickness at an elevated section to offset implants and a reduced thickness at a base section to maximize silicided contact area. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In accordance with one embodiment, a method for fabricating an integrated circuit includes simultaneously shielding a shielded region of a semiconductor substrate and exposing a surface of the shielded region of the semiconductor substrate. An ion implantation is performed to form implant areas in a non-shielded region of the semiconductor substrate adjacent the shielded region. Also, the semiconductor substrate is silicided to form a silicided area in the shielded region of the semiconductor substrate.

In another embodiment, a method for fabricating an integrated circuit is provided. In the method, a spacer is formed over a semiconductor substrate. The spacer has a base section with a first thickness and an elevated section with a second thickness greater than the first thickness. Further, the spacer defines a shielded region of the semiconductor substrate lying under the elevated section of the spacer and adjacent the base section of the spacer.

In accordance with another embodiment, an integrated circuit is provided and includes a semiconductor substrate, and a gate structure positioned on the semiconductor substrate. The integrated circuit includes a spacer formed around the gate structure on the semiconductor substrate. The spacer has a base section with a first thickness and an elevated section with a second thickness greater than the first thickness. The spacer defines a shielded region of the semiconductor substrate lying under the elevated section of the spacer and adjacent the base section of the spacer.

BRIEF DESCRIPTION OF THE DRAWINGS

Embodiments of integrated circuits with improved spacers and methods for fabricating integrated circuits with improved spacers will hereinafter be described in conjunction with the following drawing figures, wherein like numerals denote like elements, and wherein:

FIGS. 1-10 illustrate, in cross section, a portion of an integrated circuit and method steps for fabricating an integrated circuit in accordance with various embodiments herein.

DETAILED DESCRIPTION

Figure 1:
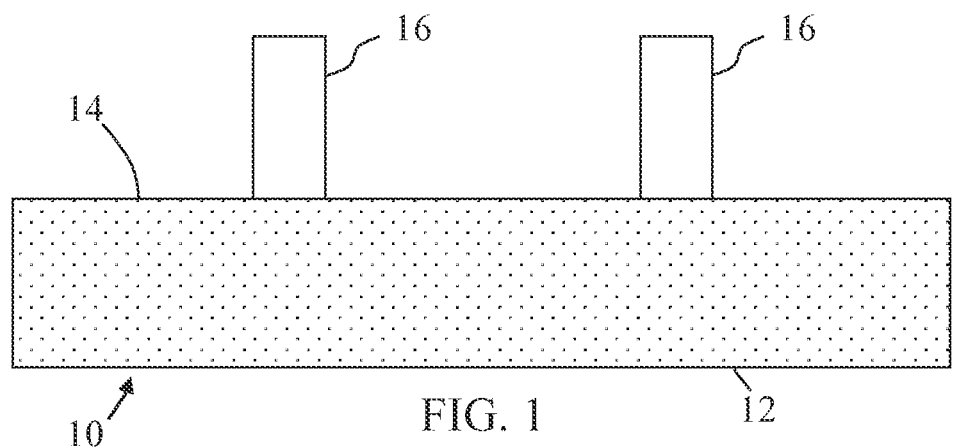

The following Detailed Description is merely exemplary in nature and is not intended to limit the integrated circuits or methods for fabricating integrated circuits as claimed herein. Furthermore, there is no intention to be bound by any expressed or implied theory presented in the preceding Technical Field, Background, Brief Summary, or the following Detailed Description. As may appear herein, the term "over" is utilized to indicate relative position between two structural elements and not necessarily to denote physical contact between structural elements. Certain terminology may appear in the following Detailed Description for the purpose of reference only and is not intended to be limiting. For example, terms such as "upper", "lower", "above", "below", "over" and "under" refer to directions in the subsequently-referenced Drawings. These and similar terms may be utilized herein to describe the orientation and/or location of a feature or element within a consistent but arbitrary frame of reference, which is made clear by reference to the text and the associated Drawings describing the component, device, and/or process under discussion.

In accordance with the various embodiments herein, integrated circuits with improved spacers and methods for fabricating integrated circuits with improved spacers are provided. As disclosed herein, problems with conventionally-formed spacers, and processing around conventionally-formed spacers, are reduced or avoided. Specifically, in conventional processing a spacer formed around a gate has a thickness sufficient to offset implants from the gate. However, the spacer thickness reduces the underlying semiconductor surface area. As a result, silicide contact formation on the reduced semiconductor surface area is inadequate to provide sufficiently low contact resistance.

As described herein, spacers are formed with variable thicknesses in order to provide sufficient implant offset, while exposing sufficient semiconductor surface area for contact formation. Specifically, each spacer is formed with a maximum thickness at an elevated section in order to provide implant blocking for formation of sufficiently offset implant areas in the semiconductor substrate. Further, each spacer is formed with a reduced thickness at a base section where the spacer interfaces with the surface of the semiconductor substrate. As a result, a shielded region of the semiconductor substrate is formed, where implant areas are blocked, but where silicidation can occur. Effectively, use the spacers provided for an increase in the contact area between gates, while retaining the implant blocking offset around each gate.

FIGS. 1-10 illustrate steps in accordance with various embodiments of methods for fabricating integrated circuits with improved spacers. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 2:
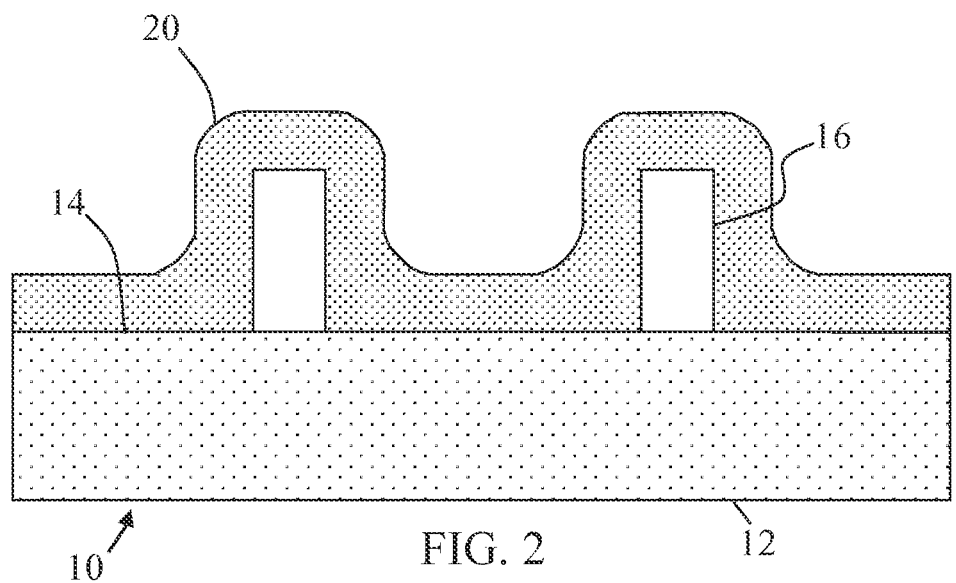

In FIG. 1, in an exemplary embodiment, the process of fabricating an integrated circuit 10 begins by providing a semiconductor substrate 12 with surface that defines a plane 14. Gate structures 16 are formed on the surface of the semiconductor substrate 12 during typical processing and may include capping layers overlying gate material formed on gate oxide. In FIG. 2, a spacer-forming material 20 is deposited over the semiconductor substrate 12 and gate structures 16. The spacer-forming material 20 is typically silicon nitride, though any appropriately etchable material suitable for blocking ion implantations may be used.

As shown in FIG. 3, the spacer-forming material 20 is etched to form intermediate spacers 22 and to expose the surface 14 of the semiconductor substrate 12 between the intermediate spacers 22. The intermediate spacers 22 have an outer surface 24 that defines a relatively constant thickness from a base section 26, adjacent, and in contact with, the semiconductor substrate 12, to an elevated section 28 distanced from the semiconductor substrate 12.

FIG. 4 illustrates two steps of an anisotropic etch process. First, an anisotropic etchant 30 is used to etch a portion of the outer surface 24 of the intermediate spacer 22. As shown, the anisotropic etchant 30 is directed at a non-perpendicular angle to the plane 14. A portion 32 of the etchant 30 is backscattered by the semiconductor substrate 12, such that a larger amount of etchant 30 reaches the base section 26 of the intermediate spacer 22 in comparison to the amount of etchant that reaches the elevated section. As a result, the etchant 30 removes a portion 34 of the base section 26 of the intermediate spacer 22 more quickly than the elevated section 28. The process is then repeated on the other side of the intermediate spacer 22 with the same etchant (indicated by arrows 36). Again, a portion 38 of the etchant 36 is backscattered by the semiconductor substrate 12 such that a larger amount of etchant 36 reaches the base section 26 of the intermediate spacer 22 and removes the portion 34 of the base section 26 at a faster rate than the elevated section 28. In an exemplary embodiment, a reactive ion etch is used to remove the portions 34 of the base section 26 with reactive ions 30, 36.

Figure 5:
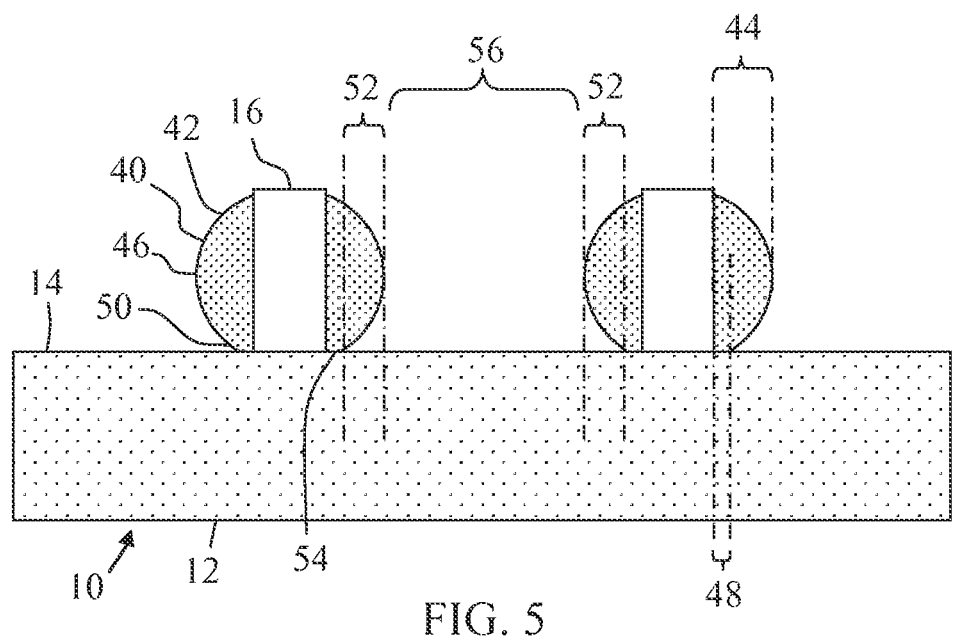

FIG. 5 illustrates the spacer 40 formed by removing the portions 34 of the intermediate spacer 22 of FIG. 4. As shown, the spacers 40 are substantially O-shaped and have a curvilinear outer surface 42. Each spacer 40 has a maximum thickness 44 at the elevated section 46, which is at about the mid-height of the gate structures 16. Each spacer 40 has a reduced thickness 48 where the base section 50 of the spacer 40 contacts the semiconductor substrate 12. The maximum thickness 44 is greater than the reduced thickness 48. As shown, the spacers 40 define shielded regions 52 in the semiconductor substrate 12 which lie under the elevated sections 46 of the spacers 40. The shielded regions 52 do not lie under the interface 54 where the spacers 40 contact the semiconductor substrate 12. The spacers 40 further define non-shielded regions 56 that do not lie under any portion of the spacers 40.

Figure 6:
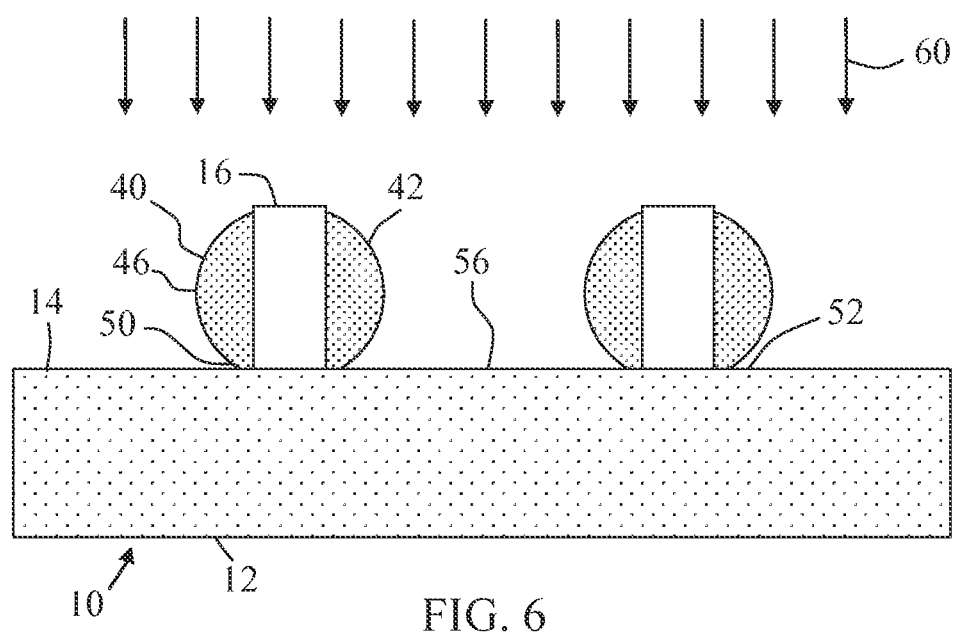
Figure 7:
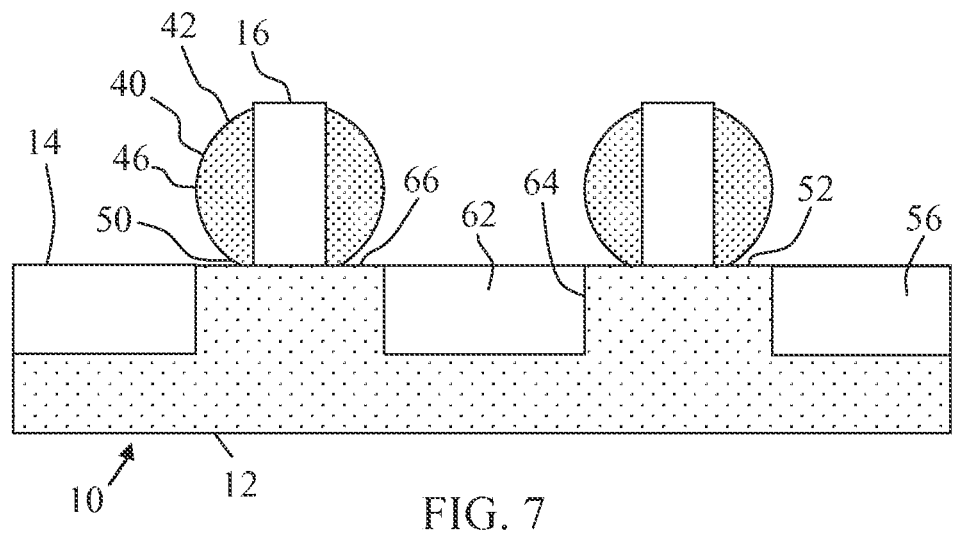

In FIG. 6, an ion implantation process directs ions 60 at the semiconductor substrate 12 in the direction perpendicular to the plane 14. As illustrated, the ions 60 can reach the non-shielded regions 56, but are blocked from the shielded regions 52 by the elevated sections 46 of the spacers 40. As a result, implant areas 62 are formed in the semiconductor substrate 12 as shown in FIG. 7. The implant areas 62 extend between the boundaries 64 dividing the shielded regions 52 from the non-shielded regions 56 and are formed exclusively in the non-shielded regions 56. The surfaces 66 of the shielded regions 52 of the semiconductor substrate 12 remain exposed, though shielded from ion implantation by the elevated sections 46 of the spacers 40.

Figure 8:
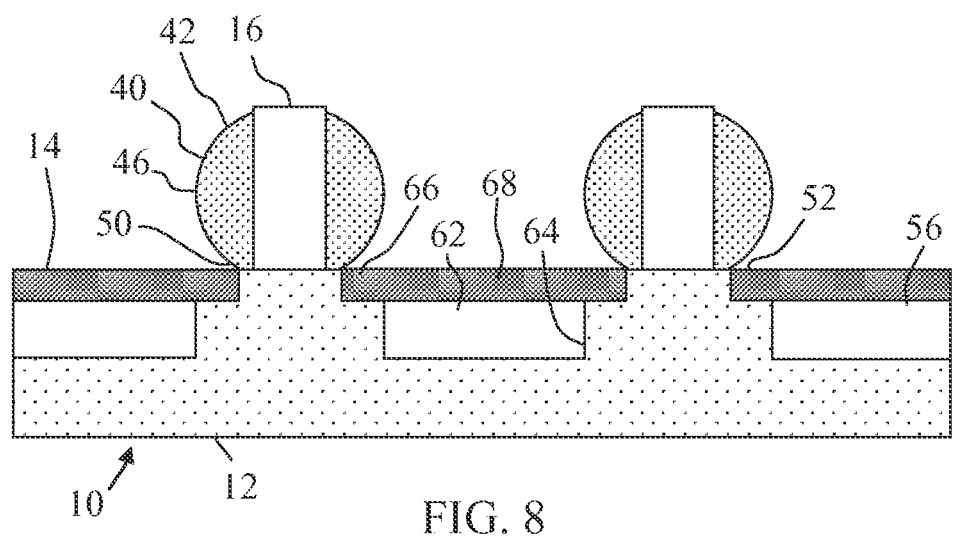

After forming the implant areas 62, a silicidation process is performed. Notably, the spacers 40 are not changed, whether by modification through etching or by removal and reformation, during the time between the ion implantation process and the silicidation process. A silicide-forming metal is deposited on the semiconductor substrate 12, including on the exposed surfaces 66 of the shielded regions 52 and in the non-shielded regions 56. As the silicide-forming metal reacts with the semiconductor substrate 12, it forms the silicided areas 68 as shown in FIG. 8. The silicided areas 68 partially lie under the spacers 40 and extend between the base sections 50 of adjacent spacers 40.

In the process illustrated in FIGS. 1-8, the spacers 40 simultaneously shield the shielded regions 52 of the semiconductor substrate 12 and expose the surface 66 of the shielded regions 52. Thus, the ion implantation is able to form implant areas 62 in the non-shielded regions 56 adjacent the shielded regions 52 and the silicidation process is able to form silicided areas 68 in the shielded regions 52 and in the non-shielded regions 56. The implant areas 62 are aligned with the outer surface 42 of the spacer 40 at the elevated section 46, i.e., at the location of the maximum thickness 44 of the spacer. The silicided areas 68 are aligned with the outer surface 42 of the spacer 40 at the base section 50, i.e., at the interface 54 between the spacer 40 and the semiconductor substrate 12 where the spacer 40 has its reduced thickness 48. These alignments may be temporary. For example, thermal annealing may cause diffusion of the implant areas 62 toward the gate structures 16.

Figure 9:
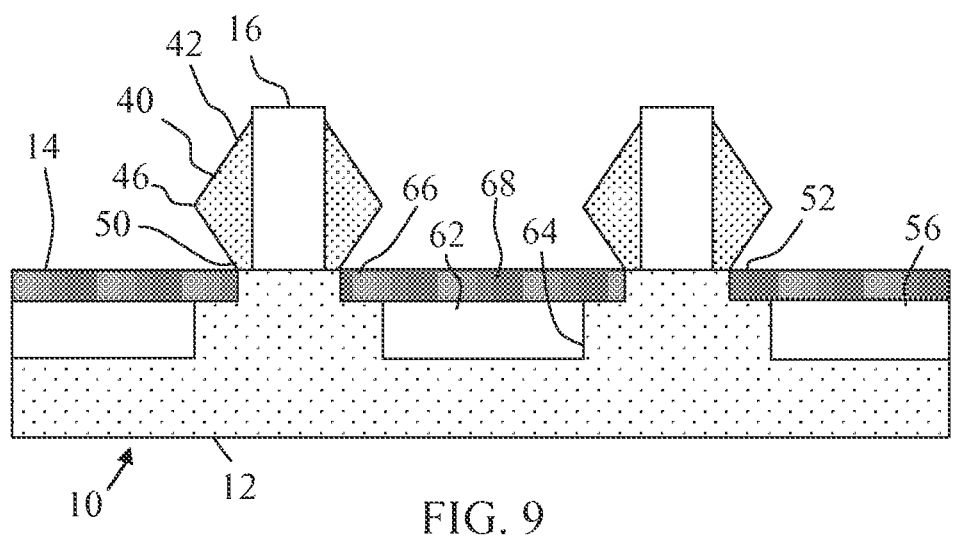
Figure 10:
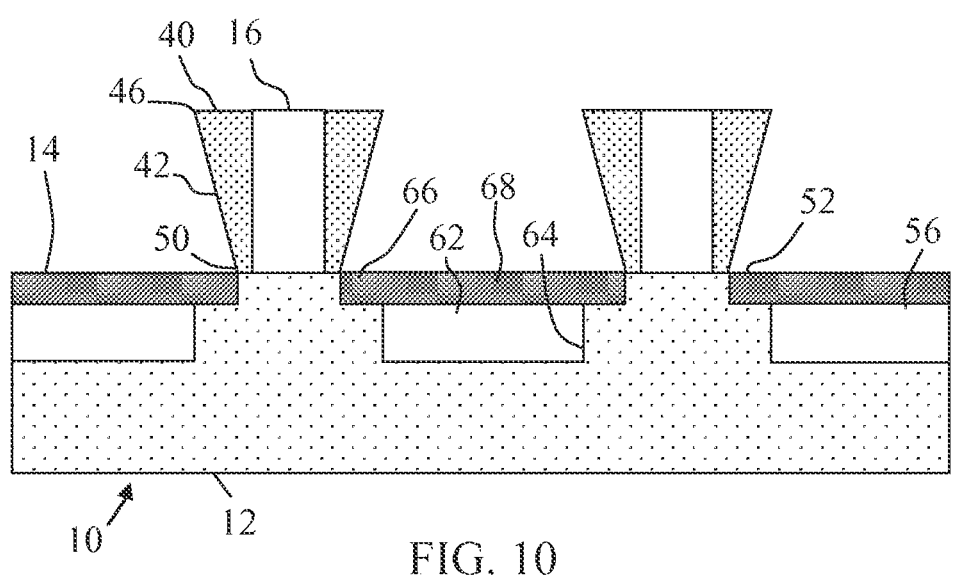

It is noted that the formation of the spacers 40 need not include the formation of intermediate spacers 22 nor the subsequent removal of the portion 34 of the intermediate spacers 22 to form spacers 40. Rather, the spacers 40 may be formed from the spacer-forming material 20 in a single or continuous etch process. Further, the spacers 40 may be formed without deposition of a continuous spacer-forming material 20. Also, while FIGS. 2-8 disclose the formation of spacers 40 having curvilinear outer surfaces 42 with maximum thicknesses near or at their mid-height, other embodiments are envisioned. For example without limitation, FIGS. 9 and 10 illustrate alternate spacers 40 which include non-curvilinear outer surfaces 42. The spacer 40 of FIG. 9 includes an elevated section 46 at about mid-height of the gate structure 16. In FIG. 10, the elevated section 46 is at the top of the gate structure 16. In these and other embodiments, the spacers 40 are able to shield the shielded regions 52 of the semiconductor substrate 12, while leaving the surfaces 66 of the shielded regions 52 exposed for silicidation or for other surface processing.

After ion implantation and silicidation results in the partially fabricated integrated circuits of FIG. 8, 9 or 10, further processing may be performed to prepare the integrated circuit 10 in its final product form, including forming contacts at the silicided areas and other front-end-of-line (FEOL) processing and back-end-of-line (BEOL) processing.

As described above, an integrated circuit is formed with an improved spacer which blocks ion implantation at a first distance (or spacer thickness) from a gate structure, and which simultaneously allows surface processing, such as silicidation, at a reduced second distance (spacer thickness) from the gate structure. As a result, implant areas are sufficiently offset from the gate structure while silicided areas have maximized area. Therefore, the implant areas do not diffuse too far under the gate structures during annealing and the silicide areas provide for sufficient contact area with lower resistance.

To briefly summarize, the integrated circuits and fabrication methods described herein have improved spacers which result in improved semiconductor performance. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit comprising:
    simultaneously shielding a shielded region of a semiconductor substrate and exposing a surface of the shielded region of the semiconductor substrate by forming a spacer over the semiconductor substrate, wherein the spacer has an outer surface defining a maximum thickness at an elevated section and a reduced thickness at a base section;
    performing an ion implantation to form implant areas in a non-shielded region of the semiconductor substrate adjacent the shielded region; and
    siliciding the semiconductor substrate to form a silicided area in the shielded region of the semiconductor substrate.

2. The method of claim 1 wherein forming the spacer over the semiconductor substrate comprises:
    depositing a spacer forming layer over the semiconductor substrate;
    etching the spacer forming layer to form an intermediate spacer with an intermediate outer surface having the maximum thickness at an intermediate elevated section and at an intermediate base section;
    etching a portion of the intermediate base section to establish the spacer with the base section having the reduced thickness.

3. The method of claim 2 wherein the semiconductor substrate defines a plane and wherein etching the portion of the intermediate base section comprises: performing an anisotropic etch by directing an etchant to the intermediate spacer at an angle non-perpendicular to the plane, wherein backscatter of the etchant results in an increased rate of removal of the portion of the intermediate base section.

4. The method of claim 2 wherein the semiconductor substrate defines a plane and wherein etching the portion of the intermediate base section comprises: performing a reactive ion etch by directing reactive ions to the intermediate spacer at an angle non-perpendicular to the plane, wherein backscatter of the reactive ions results in an increased rate of removal of the portion of the intermediate base section.

5. The method of claim 1 wherein performing the ion implantation comprises forming implant areas in the semiconductor substrate aligned with the outer surface of the elevated section of the spacer, and wherein siliciding the semiconductor substrate forms silicided areas in the shielded region of the semiconductor substrate aligned with the outer surface of the base section of the spacer.

6. The method of claim 1 wherein the semiconductor substrate defines a plane and wherein performing an ion implantation comprises directing ions at the semiconductor substrate perpendicular to the plane and using the elevated section of the spacer as a mask to implant ions exclusively in the non-shielded region of the semiconductor substrate.

7. The method of claim 1 wherein siliciding the semiconductor substrate comprises forming the silicided area in the shielded region aligned with the outer surface of the base section of the spacer and in a portion of the non-shielded region.

8. The method of claim 1 wherein forming the spacer comprises:
    defining the shielded region of the semiconductor substrate as lying under the elevated section of the spacer and adjacent the base section of the spacer; and
    defining the non-shielded region of the semiconductor substrate as lying adjacent the shielded region of the semiconductor substrate.

9. The method of claim 8 wherein siliciding the semiconductor substrate comprises forming a silicided area in the shielded region and in a portion of the non-shielded region.

10. A method for fabricating an integrated circuit comprising:
    forming a spacer over a semiconductor substrate, wherein the spacer has a base section with a first thickness and an elevated section with a second thickness greater than the first thickness, wherein the spacer defines a shielded region of the semiconductor substrate lying under the elevated section of the spacer and adjacent the base section of the spacer, and wherein the spacer defines a non-shielded region of the semiconductor substrate that does not lie under the elevated section of the spacer; and
    siliciding the semiconductor substrate to form silicided areas in the shielded region and in a portion of the non-shielded region.

11. The method of claim 10 further comprising forming a gate structure, wherein forming the spacer comprises forming the spacer around the gate structure.

12. The method of claim 11 wherein forming the spacer over the semiconductor substrate comprises:
    depositing a spacer forming layer over the semiconductor substrate and the gate structure;
    etching the spacer forming layer to form an intermediate spacer around the gate structure; and
    etching portions of the intermediate spacer adjacent the semiconductor substrate to establish the spacer with the base section and elevated section.

13. The method of claim 12 wherein the semiconductor substrate defines a plane and wherein etching the portions of the intermediate spacer adjacent the semiconductor substrate to establish the spacer with the base section and elevated section comprises:

performing an anisotropic etch by directing an etchant to the intermediate spacer at an angle non-perpendicular to the plane, wherein backscatter of the etchant results in the removal of the portions of the intermediate spacer adjacent the semiconductor substrate more quickly than portions of the intermediate spacer non-adjacent the semiconductor substrate.

14. The method of claim 12 wherein the semiconductor substrate defines a plane and wherein etching the portions of the intermediate spacer adjacent the semiconductor substrate to establish the spacer with the base section and elevated section comprises: performing a reactive ion etch by directing reactive ions to the intermediate spacer at an angle non-perpendicular to the plane, wherein backscatter of the reactive ions results in the removal of the portions of the intermediate spacer adjacent the semiconductor substrate more quickly than portions of the intermediate spacer non-adjacent the semiconductor substrate.

15. The method of claim 10 further comprising performing an ion implantation to form implant areas exclusively in the non-shielded region of the semiconductor substrate.

16. The method of claim 10 wherein the semiconductor substrate defines a plane and wherein performing an ion implantation comprises directing ions at the semiconductor substrate perpendicular to the plane and using the elevated section of the spacer as a mask to implant ions exclusively in the non-shielded region of the semiconductor substrate.

17. A method for fabricating an integrated circuit comprising:

depositing a spacer forming layer over a semiconductor substrate defining a plane;

etching the spacer forming layer to form an intermediate spacer; and performing an anisotropic etch by directing an etchant to the intermediate spacer at an angle non-perpendicular to the plane, wherein backscatter of the etchant results in removal of portions of the intermediate spacer adjacent the semiconductor substrate more quickly than portions of the intermediate spacer non-adjacent the semiconductor substrate to establish a spacer having a base section with a first thickness and an elevated section with a second thickness greater than the first thickness.

18. The method of claim 17 wherein the spacer defines a shielded region of the semiconductor substrate lying under the elevated section of the spacer and adjacent the base section of the spacer.

19. The method of claim 17 wherein performing the anisotropic etch by directing the etchant to the intermediate spacer comprises performing a reactive ion etch by directing reactive ions to the intermediate spacer.

20. The method of claim 17 wherein the spacer defines a non-shielded region of the semiconductor substrate that does not lie under the elevated section of the spacer, the method further comprising siliciding the semiconductor substrate to form silicided areas in the shielded region and in a portion of the non-shielded region.

* * * * *